United States Patent [19]
Tusler et al.

[11] Patent Number: 5,995,377
[45] Date of Patent: Nov. 30, 1999

[54] REDUCED STATIC RAID ENCLOSURE

[75] Inventors: Ralph Michael Tusler, Monument; Mark S. Lewis; Reuben Martinez, both of Colorado Springs, all of Colo.

[73] Assignee: Digital Equipment Corporation, Maynard, Mass.

[21] Appl. No.: 08/791,667

[22] Filed: Jan. 31, 1997

Related U.S. Application Data

[63] Continuation of application No. 08/420,922, Apr. 12, 1995, abandoned.

[51] Int. Cl.$^6$ ..................................................... H05K 7/14
[52] U.S. Cl. ........................... 361/796; 361/683; 361/727; 361/802; 312/223.2
[58] Field of Search ................................... 361/683, 685, 361/724, 727, 796, 797, 802; 312/223.1, 223.2; 439/61, 62, 377

[56] References Cited

U.S. PATENT DOCUMENTS

| | | | |
|---|---|---|---|
| 4,004,194 | 1/1977 | Doerflinger et al. | 361/714 |
| 4,167,032 | 9/1979 | Scagnelli | 361/802 |
| 4,509,647 | 4/1985 | Shevchuk | 211/41.17 |
| 4,592,610 | 6/1986 | Bowls | 439/377 |
| 5,031,075 | 7/1991 | Casanova et al. | 361/802 |
| 5,313,369 | 5/1994 | Lewis et al. | 361/796 |
| 5,340,340 | 8/1994 | Hastings et al. | 312/223.1 |

FOREIGN PATENT DOCUMENTS

| | | | |
|---|---|---|---|
| 0 438 013 A2 | 7/1991 | European Pat. Off. | H05K 7/14 |
| 1354308 | 1/1964 | France | 312/223.1 |
| 3211 758 A1 | 10/1983 | Germany | H05K 7/14 |

*Primary Examiner*—Leo P. Picard
*Assistant Examiner*—Jayprakash N. Gandhi
*Attorney, Agent, or Firm*—William J. Kubida; Holland & Hart LLP

[57] ABSTRACT

A low static enclosure has an interior for holding an electronic device therein. The electronic device has opposing walls each having a guide rail thereon. The enclosure has a bottom, a top, and a backplane between the bottom and top at their respective back edges. The backplane has an electric connector on its interior surface. The bottom and top each have a flat continuous interior facing surface with a groove extending from the front edge to the back edge. The grooves on the bottom and top are for cooperation with the guide rails on the opposing walls of the electronic device to slide the electronic device along the bottom and top respectively so that an electric connector on the electronic device mates with the electric connector on the interior surface of the backplane. The flat continuous interior facing surfaces of the bottom and top discourage ESD between the surfaces and the electronic device.

10 Claims, 3 Drawing Sheets

REDUCED STATIC RAID ENCLOSURE

This application is a continuation of application Ser. No. 08/420,922, filed Apr. 12, 1995 now abandoned.

BACKGROUND OF THE INVENTION

The invention is related to device enclosures and particularly to controlling static electricity generated by the insertion and removal of devices in the enclosure.

A RAID array (redundant array of independent disks) functions as one large logical mass storage device for storing data in a computer system. The actual array is a physical set of mass storage devices—most commonly hard disk drives. According to some prior art implementations, each physical disk drive device resides within an array enclosure, and can be separately inserted and removed. Some implementations, such as the model BA350 modular storage shelf from Digital Equipment Corporation, allow "hot swapping" of single devices to and from the array—that is, disk drives can be inserted into or removed from the array enclosure during operation of the array.

The Digital Equipment Corporation model BA350 modular storage shelf enclosure is shown in FIG. 1. The disk drive devices 10 of the array reside within modular device enclosures 12 having guide rails 14 which are designed to slide along opposing inward facing ribs 16 in the array enclosure. The guide rails 14 and ribs 16 guide the device 10 toward a backplane 18 at the back of the array enclosure 20, where a connector on the device mates with a backplane connector. As can be seen, the ribs 16 and structural ribs 17 are protrusions extending from the bottom and top surfaces of the enclosure 20 toward the device 10.

It has been discovered that such array enclosures are subject to static electricity problems. The continual sliding of devices along the rails of the array enclosure causes static charges to build up on the inward facing protruding ribs 16 and 17. Then, when a device contacts the backplane connector, thereby providing a discharge path, an electrostatic discharge (ESD) occurs at the shortened air gap between the ribs and the sliding device. This ESD can cause electrical component failures on the device itself. These ESD problems are particularly onerous in a "hot swap" environment where disk devices are continually inserted into and removed from the array enclosure. It is desirable, therefore, to provide an array enclosure which protects the devices installed therein from the effects of ESD.

SUMMARY OF THE INVENTION

In accordance with the present invention, there is provided an array enclosure designed to protect electronic devices installed therein from ESD. The array enclosure is used for holding electronic devices having walls with guide rails formed thereon.

The array enclosure has a top, a bottom, and sidewalls. A backplane resides between the top and bottom at their respective back edges. Electric connectors reside on the interior surface of the backplane. The bottom and top have flat continuous interior surfaces with spaced apart grooves formed therein and extending from the front edge to the back edge. These grooves cooperate with the guide rails on the devices. The guide rails on a device slide along the grooves to guide the electric connector on the device toward the electric connector on the interior surface of the backplane as the device is inserted into the enclosure.

More specifically, the top, bottom, and sidewalls of the enclosure are formed of sheet metal. Plastic top and bottom shelves cover the interior surfaces of the top and bottom respectively, and the grooves are formed in the shelves.

The flat continuous nature of the interior surfaces of the top and bottom shelves prevent ESD between the interior surfaces and the device because there are no protrusions from the shelves extending toward the device. In addition, the grooves form ribs on the exterior facing surfaces of the shelves, encouraging ESD between the shelves and the sheet metal top and bottom rather than between the shelves and the sliding device.

To further discourage the generation of electrostatic charges, the top and bottom shelves are formed of the same plastic insulating material as the device walls on which the guide rails are formed.

DETAILED DESCRIPTION OF THE PREFERRED EMBODIMENT

Figure 3:
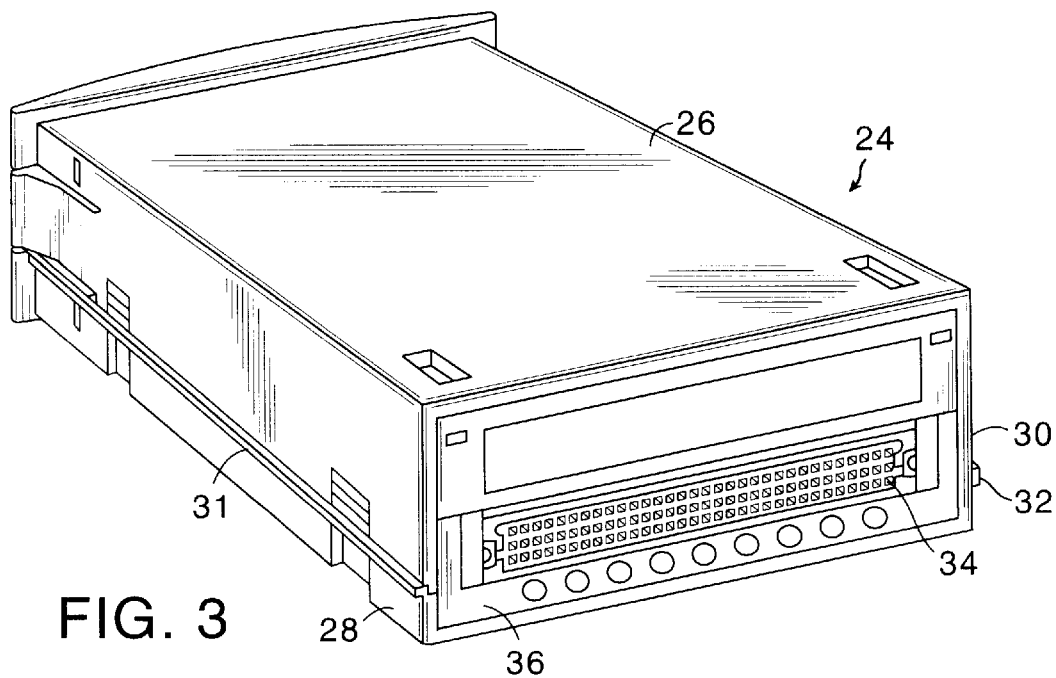
FIG. 3 is a perspective view of the electronic device of FIG. 2.
Figure 2:
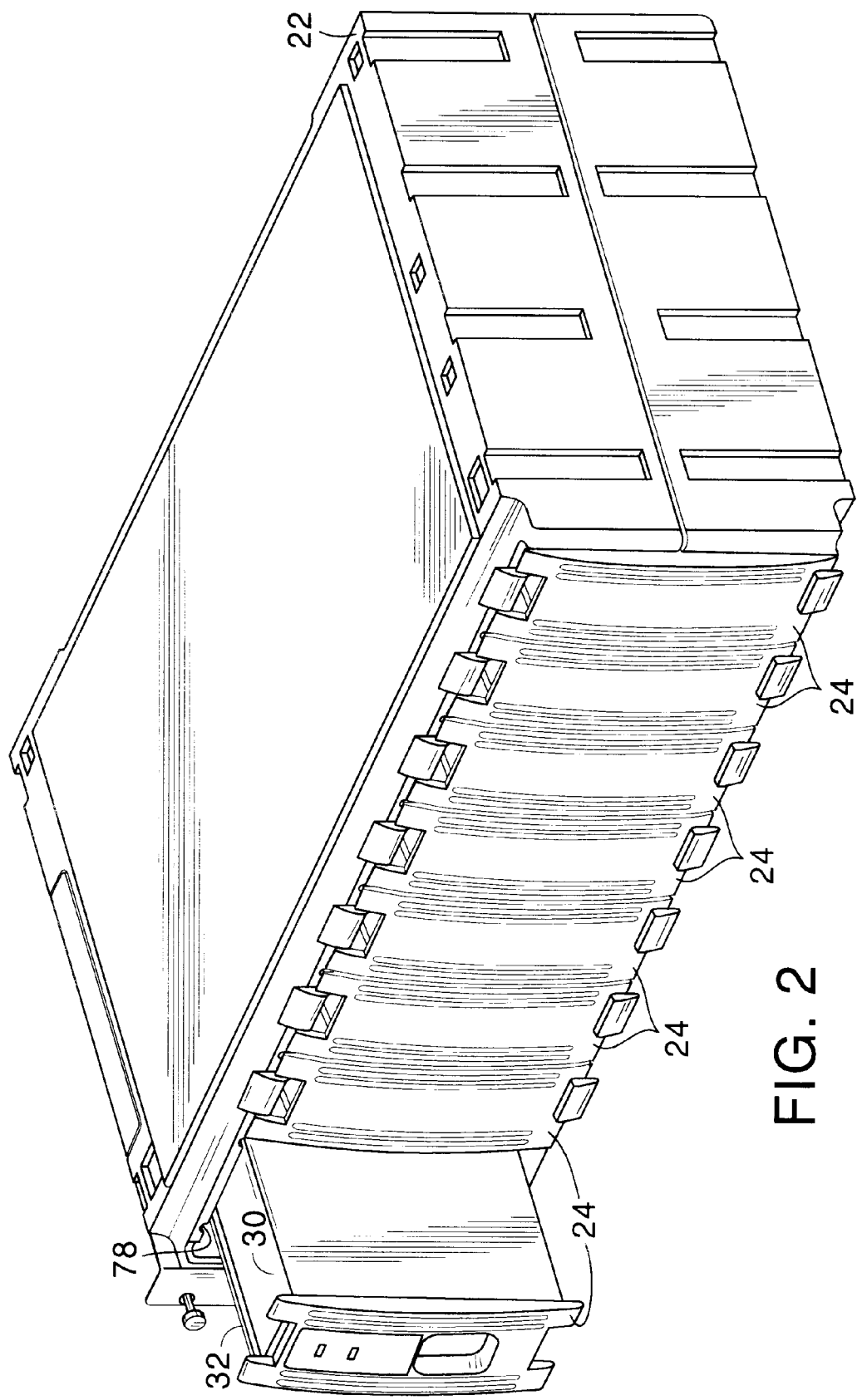
FIG. 2 is a perspective view of an array including an array enclosure according to the principles of the invention in which electronic devices are slidably mounted.

In FIG. 2 there is shown an array enclosure 22 designed for holding electronic devices 24 such as the disk drives of a RAID array. The devices 24 are each slidably inserted or removed from the enclosure 22. In FIG. 3 a rear view of one of the electronic devices 24 is shown. The device 24 is enclosed in a plastic casing 26 having opposing walls 28 and 30. The wall 28 has a guide rail 31 thereon; likewise, and the wall 30 has a guide rail 32 thereon. An electric connector 34 extends through the device casing 26 on a third wall 36.

Figure 4:
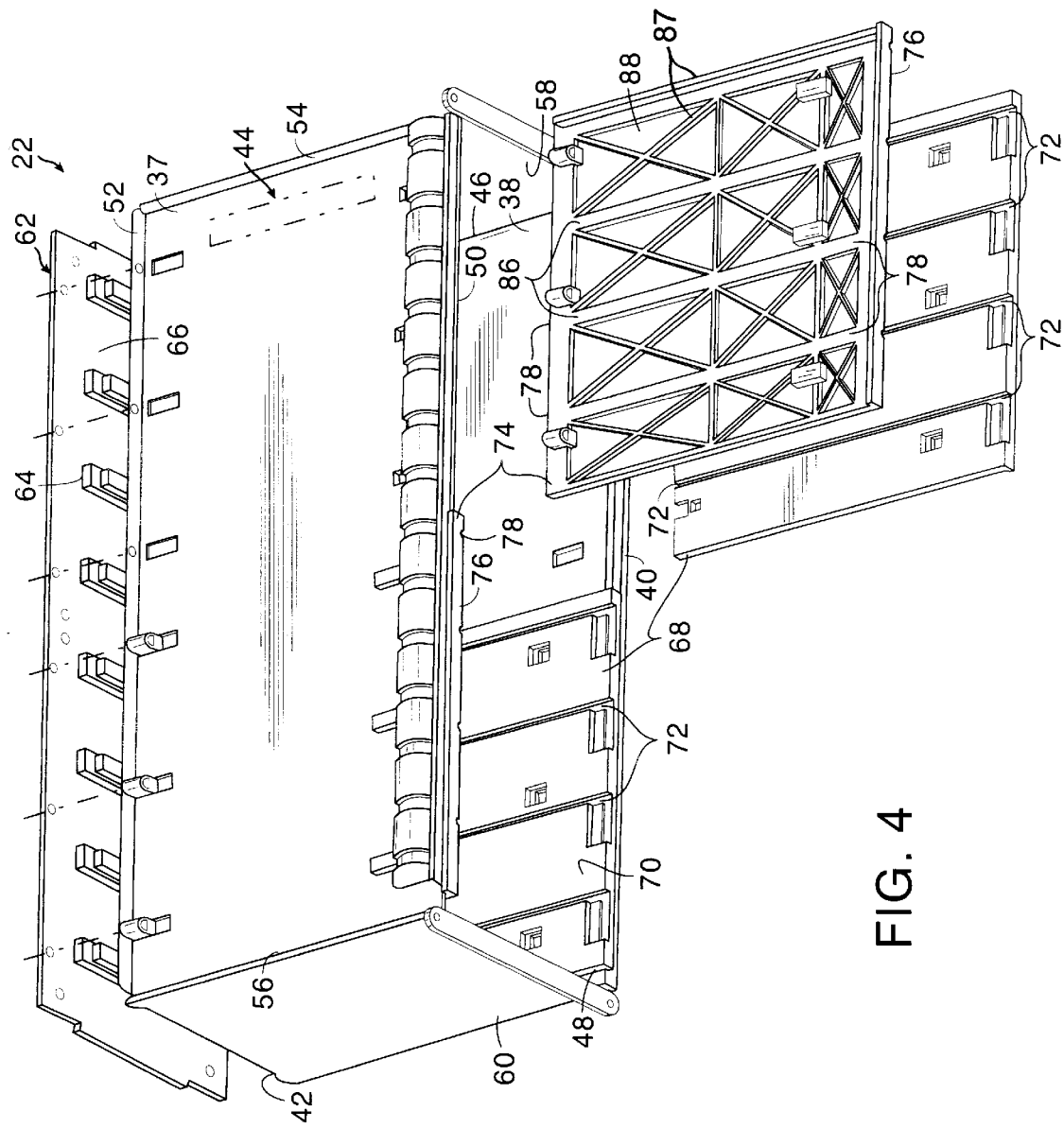
FIG. 4 is a perspective assembly drawing of the array enclosure of FIG. 2.

Referring now to FIGS. 2 and 4, the array enclosure 22 includes a sheet metal chassis 37 (FIG. 4). The chassis 37 has a sheet metal bottom 38 having a front edge 40, a back edge 42, and side edges 46 and 48. The enclosure 22 also has a sheet metal top 44 having a front edge 50, a back edge 52, and side edges 54 and 56. Spaced apart opposing sheet metal sidewalls 58 and 60 extend laterally from the side edges 46 and 54, and 48 and 56. A backplane 62 resides between the bottom 38 and top 44 at the back of the enclosure, at the back edges 42 and 52 of the bottom 38 and top 44 respectively. Electric connectors 64 on the interior surface 66 of the backplane 62 mate with the electric connectors 34 on the devices 24 when the devices 24 are installed in the enclosure 22.

A plastic bottom shelf 68 covers the interior surface of the bottom 38. This bottom shelf 68 has a flat continuous interior facing surface 70 with spaced apart grooves 72 formed therein. The grooves 72 extend from the front edge 40 of the bottom 38 to the back edge 42 of the bottom 38. Likewise, a plastic top shelf 74 having a flat continuous interior facing surface 76 with similar spaced apart grooves 78 formed therein covers the interior surface of the top 44. The grooves 72 and 78 cooperate with the guide rails 31 and 32 on the device walls 28 and 32 respectively during insertion of a device 24 into the enclosure 22 or during removal of a device 24 from the enclosure 22. During insertion of a device 24 into the enclosure 22 (FIG. 2), the guide rail 31 slides along a groove 72 on the bottom shelf 68, as the guide rail 32 slides along an opposing groove 78 on the top shelf 74, thereby guiding the electric connector 34 on the device 24 toward the electric connector 64 on the backplane 62 and ensuring proper mating of the connectors 34 and 64 for operation.

Figure 1:
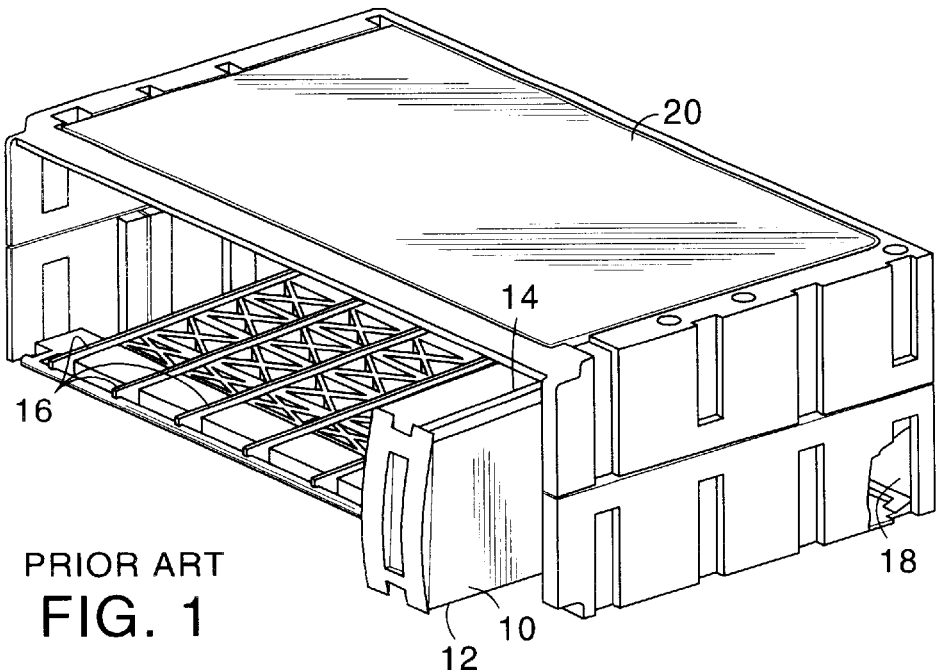
FIG. 1 is a perspective view of a prior art RAID enclosure.

The continuous flat nature of the bottom shelf 68 and top shelf 74 eliminates protrusions such as the prior art ribs (FIG. 1, ribs 16 and 17) which can tend to encourage electrostatic discharge to a device 24 within the enclosure 22. Moreover, as can be seen by examining the exterior facing surface 84 of the top shelf 74 as shown in FIG. 4, the grooves 78 form ribs 86 on the surface 84 which face toward the sheet metal top 44— and not toward the interior of the enclosure 22 structural ribs 87 also face toward the sheet metal top 44. Therefore, electrostatic charge which might collect on these ribs 86 and 87 has a shortened discharge path to the sheet metal top 44, encouraging ESD to the chassis top 44 rather than to a device 24 which is being inserted or removed from the enclosure 22.

To reduce the generation of electrostatic charge during insertion or removal of a device 24 in the enclosure 22, the device casing 26 (including the walls 28 and 32) and the top shelf 74 and bottom shelf 68 are injection molded of the same plastic insulating material, which can be for example polycarbonite ABS blend.

It is apparent that, within the scope of the invention, modifications and different arrangements may be made other than as herein disclosed. For example, the chassis top and bottom of the enclosure, herein shown manufactured of sheet metal, can be manufactured of any suitable material. Furthermore, the shelves, though shown here as separate plastic pieces covering the sheet metal top and bottom, could be integrated into the top and bottom so as to form a single part. In this case, the interior surface of the bottom itself is a smooth continuous surface having the grooves formed therein for cooperation with the device guide rails, as is the interior surface of the top. Finally, it is conceivable that an electronic device might have only one sliding surface having one or more guide rails, in which case only the bottom or top of the enclosure need provide a continuous flat interior surface with grooves formed therein for cooperation with the guide rails. The present disclosure is merely illustrative, the invention comprehending all variations thereof.

What is claimed is:

1. An enclosure having an interior for holding an electronic device, the electronic device having an electric connector and a device wall with a guide rail, said enclosure comprising:

a sheet metal bottom having a front edge, a back edge, and side edges;

spaced apart opposing sidewalls at the side edges of the bottom and extending laterally away therefrom;

a backplane at the back edge of the bottom, the backplane extending between the sidewalls and laterally away from the bottom, the backplane having an interior surface facing the front edge of the bottom;

an electric connector on the interior surface of the backplane between the sidewalls; and a bottom shelf covering the interior surface of the bottom, the bottom shelf being manufactured of an insulating material, the shelf having a flat continuous interior facing surface with a bottom groove extending from the front edge to the back edge, so that as an electronic device is placed in the enclosure, the bottom groove cooperates with the guide rail on the electronic device wall to slide the electronic device along the bottom shelf from the front edge to the back edge so that the electric connector on the electronic device mates with the electric connector on the interior surface of the backplane.

2. The enclosure of claim 1 wherein the bottom groove forms a rib having an apex extending toward the bottom.

3. The enclosure of claim 2 wherein the enclosure is for holding an electronic device with a device wall manufactured of the insulating material.

4. The enclosure of claim 1 wherein the enclosure is for holding an electronic device having a device wall with a guide rail and an opposing device wall with a guide rail, the enclosure further comprising:

a sheet metal top having a front edge, a back edge, and side edges, the backplane between the bottom and top at the back edge of the bottom and the back edge of the top, the backplane extending between the sidewalls; and a top shelf covering the interior surface of the top, the top shelf being manufactured of the insulating material, the top shelf having a flat continuous interior facing surface with a top groove extending from the front edge to the back edge, so that as an electronic device is placed in the enclosure, the top groove on the opposing device wall to slide the electronic device along the top shelf from the front edge to the back edge so that the electric connector on the electronic device mates with the electric connector on the interior surface of the backplane.

5. The enclosure of claim 4 wherein the bottom groove formed in the bottom shelf forms a rib having an apex extending toward the bottom, and wherein the top groove formed in the top shelf forms a rib having an apex extending toward the top.

6. The enclosure of claim 5 wherein the enclosure is for holding an electronic device having a device wall with a guide rail and an opposing device wall with a guide rail, the device wall and opposing device wall being manufactured of the insulating material.

7. An enclosure having an interior for holding an electronic device, the electronic device having an electric connector and opposing device walls each with a guide rail, said enclosure comprising:

a sheet metal bottom having a front edge, a back edge, and side edges;

a sheet metal top having a front edge, a back edge, and side edges;

spaced apart opposing sidewalls at the side edges of the bottom and extending laterally away from the bottom and toward the side edges of the top;

a backplane at the back edge of the bottom and the back edge of the top, the backplane between the bottom and top and extending the distance between the sidewalls, the backplane having an interior surface facing the front edge of the bottom and the front edge of the top;

an electric connector on the interior surface of the backplane;

a bottom shelf covering the interior surface of the bottom, the bottom shelf being manufactured of the insulating material, the bottom shelf having a flat continuous interior facing surface with a bottom groove extending from the front edge of the bottom to the back edge of the bottom; and a top shelf covering the interior surface of the top, the top shelf being manufactured of insulating the material, the top shelf having a flat continuous interior facing surface with a top groove extending from the front edge of the top to the back edge of the top, so that as an electronic device is placed in the enclosure, the bottom groove and top groove cooperate with the guide rails on the opposing device walls to slide the electronic device along the bottom shelf and top shelf respectively from the bottom front edge and top front edge to the bottom back edge and top back edge so that the electric connector on the electronic device mates with the electric connector on the interior surface of the backplane.

8. The enclosure of claim 7 wherein the bottom groove forms a rib having an apex extending toward the bottom, and wherein the top groove forms a rib having an apex extending toward the top.

9. The enclosure of claim 8 wherein the enclosure is for holding an electronic device having opposing device walls manufactured of the insulating material.

10. An enclosure having an interior for holding a plurality of electronic devices, each of the electronic devices having an electric connector and opposing device walls each with a guide rail, the device walls being manufactured of an insulating material, the enclosure comprising:

a sheet metal bottom having a front edge, a back edge, and side edges;

a sheet metal top having a front edge, a back edge, and side edges;

spaced apart opposing sidewalls at the side edges of the bottom and extending laterally away from the bottom and toward the side edges of the top;

a backplane at the back edge of the bottom and the back edge of the top, the backplane between the bottom and top and extending between the sidewalls, the backplane having an interior surface facing the front edge of the bottom and the front edge of the top;

electric connectors on the interior surface of the backplane;

a bottom shelf covering the interior surface of the bottom, the bottom shelf being manufactured of an insulating material, the bottom shelf having a flat continuous interior facing surface with spaced apart grooves extending from the front edge of the bottom to the back edge of the bottom; and a top shelf covering the interior surface of the top, the top shelf being manufactured of the insulating material, the top shelf having a flat continuous interior facing surface with spaced apart grooves extending from the front edge of the top to the back edge of the top, so that as electronic devices are placed in the enclosure, each groove on the bottom shelf and top shelf cooperates with a corresponding guide rail on the opposing device walls of one of the electronic devices to slide the electronic device along the bottom shelf and top shelf respectively from the bottom front edge and top front edge to the bottom back edge and top back edge so that the electric connector on the electronic device mates with one of the electric connectors on the interior surface of the backplane.

* * * * *